(12) United States Patent
Tombs et al.

(10) Patent No.: US 9,516,744 B2
(45) Date of Patent: Dec. 6, 2016

(54) WRAP-AROUND MICRO-WIRE CIRCUIT METHOD

(71) Applicants: Thomas Nathaniel Tombs, Rochester, NY (US); Ronald Steven Cok, Rochester, NY (US); Christopher R. Morton, Webster, NY (US)

(72) Inventors: Thomas Nathaniel Tombs, Rochester, NY (US); Ronald Steven Cok, Rochester, NY (US); Christopher R. Morton, Webster, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 220 days.

(21) Appl. No.: 14/253,939

(22) Filed: Apr. 16, 2014

(65) Prior Publication Data

US 2015/0305138 A1    Oct. 22, 2015

(51) Int. Cl.
*H01R 43/00* (2006.01)
*H05K 1/02* (2006.01)
(Continued)

(52) U.S. Cl.
CPC ............... *H05K 1/028* (2013.01); *G06F 3/044* (2013.01); *H05K 1/0274* (2013.01); *H05K 1/189* (2013.01); *H05K 3/107* (2013.01); *H05K 3/1258* (2013.01); *H05K 3/22* (2013.01); *H05K 3/4635* (2013.01); *G06F 2203/04103* (2013.01); *H05K 2201/0108* (2013.01); *H05K 2201/055* (2013.01); *H05K 2201/056* (2013.01); *H05K 2201/10121* (2013.01); *H05K 2201/10128* (2013.01); *Y10T 29/4913* (2015.01); *Y10T 29/49156* (2015.01);
(Continued)

(58) Field of Classification Search
CPC G02F 1/133305; G02F 1/1333; G02F 1/1347; G06F 2203/04103; G06F 3/041; G06F 2203/04102; Y10T 29/49117; B32B 2457/202
USPC .......... 29/825, 829, 831, 846, 850; 345/4, 5, 345/173, 174
See application file for complete search history.

(56) References Cited

U.S. PATENT DOCUMENTS 5,520,112 A    5/1996   Schleinz et al.
6,501,528 B1 * 12/2002  Hamada ............ G02F 1/133305
                                                    345/4

(Continued)

FOREIGN PATENT DOCUMENTS

CN            102063951       7/2013

*Primary Examiner* — Thiem Phan
(74) *Attorney, Agent, or Firm* — Raymond L. Owens; William R. Zimmerli; Kevin E. Spaulding

(57) ABSTRACT

A method of making a micro-wire circuit structure adapted for wrapping includes providing a display and a flexible substrate. The flexible substrate includes a plurality of electrically conductive micro-wires on, in, or adjacent to a common side of the flexible substrate and forming micro-wire electrodes in a touch portion of the flexible substrate. One or more electrical circuits is located on or in a circuit portion of the flexible substrate and one or more micro-wires electrically connects the one or more electrical circuits to corresponding micro-wire electrodes. The flexible substrate is located in relation to the display with the touch portion located adjacent to a display viewing side, the circuit portion located adjacent to a display back side, and an edge portion of the flexible substrate wrapping around a display edge from the display viewing side to the display back side.

18 Claims, 13 Drawing Sheets

(51) Int. Cl.
  *H05K 3/22*  (2006.01)
  *H05K 1/18*  (2006.01)
  *H05K 3/10*  (2006.01)
  *H05K 3/12*  (2006.01)
  *H05K 3/46*  (2006.01)
  *G06F 3/044* (2006.01)

(52) U.S. Cl.
  CPC ..... *Y10T 29/49158* (2015.01); *Y10T 156/1015* (2015.01)

(56) References Cited

U.S. PATENT DOCUMENTS

| | | |
|---|---|---|
| 7,202,179 B2 | 4/2007 | Taussig et al. |
| 7,792,558 B2 | 9/2010 | Bang et al. |
| 8,017,884 B2 | 9/2011 | Huang et al. |
| 8,179,381 B2 | 5/2012 | Frey et al. |
| 2006/0055864 A1 | 3/2006 | Matsumura et al. |
| 2010/0026664 A1 | 2/2010 | Geaghan |
| 2010/0328248 A1 | 12/2010 | Mozdzyn |
| 2011/0007011 A1 | 1/2011 | Mozdzyn |
| 2011/0099805 A1 | 5/2011 | Lee |
| 2011/0102370 A1 | 5/2011 | Kono et al. |

\* cited by examiner

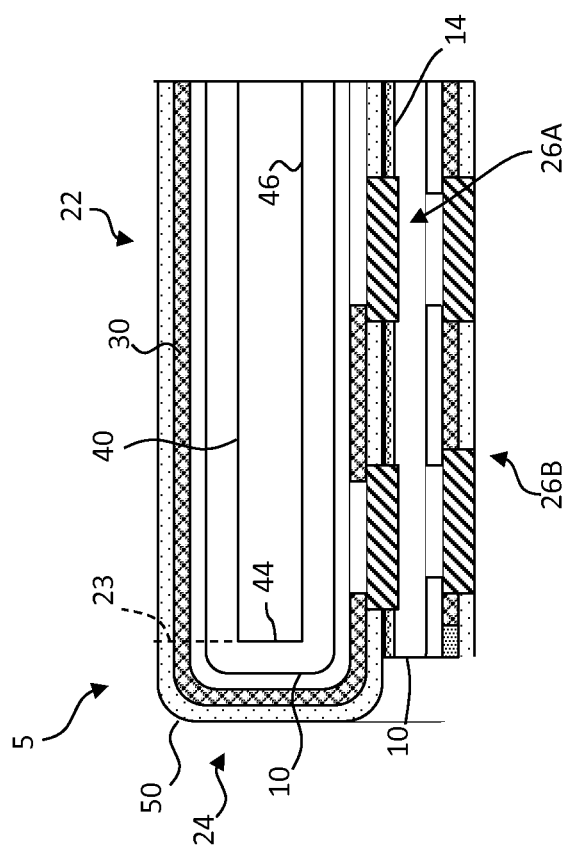

WRAP-AROUND MICRO-WIRE CIRCUIT METHOD

CROSS REFERENCE TO RELATED APPLICATIONS

Reference is made to commonly-assigned, co-pending U.S. patent application Ser. No. 14/253,929, (now U.S. Publication No. 2015/0305147), filed Apr. 16, 2014, entitled "Wrap-Around Micro-Wire Circuit Structure" by Tombs et al and to commonly-assigned, co-pending U.S. patent application Ser. No. 14/217,539 (now U.S. Publication No. 2015/0271930), filed Mar. 18, 2014 entitled "Making Multi-Layer Micro-Wire Structure" by Cok, and to commonly-assigned, U.S. patent application Ser. No. 14/012,150 (now U.S. Pat. No.8,932,474), filed Aug. 28, 2013 entitled "Imprinted Multi-Layer Micro-Structure Method" by Cok, the disclosures of which are incorporated herein.

FIELD OF THE INVENTION

The present invention relates to transparent electrodes having electrically conductive micro-wires and integrated circuits formed on a common flexible substrate.

BACKGROUND OF THE INVENTION

Transparent electrical conductors are widely used in the flat-panel display industry to form electrodes that are used to electrically switch light-emitting or light-transmitting properties of a display pixel, for example in liquid crystal or organic light-emitting diode displays. Transparent conductive electrodes are also used in touch screens in conjunction with displays. In such applications, the transparency and conductivity of the transparent electrodes are important attributes. In general, it is desired that transparent conductors have a high transparency (for example, greater than 90% in the visible spectrum) and a low electrical resistivity (for example, less than 10 ohms/square).

Transparent conductive electrodes used in touch screens are typically formed on a substrate that is mounted on a viewing surface of a display and the transparent electrodes are typically controlled by integrated circuit controllers mounted on a substrate separate from the touch screen substrate. The transparent conductive electrodes are electrically connected to their integrated circuit controllers through a flexible connector cable electrically connected to the transparent conductive electrode substrate. In some designs, the touch screen integrated circuit controllers are mounted on the flexible cable itself. The flexible connector cable is then electrically connected to other parts of the display and touch screen system. Such a conventional design requires two or three substrates, each with associated manufacturing steps, and electrical interconnections.

Transparent conductive electrodes are conventionally made of transparent conductive metal oxides. Such conductive materials are well known in the display and touch-screen industries and have a number of disadvantages, including limited transparency and conductivity and a tendency to crack under mechanical or environmental stress. Typical prior-art conductive electrode materials include conductive metal oxides such as indium tin oxide (ITO) or very thin layers of metal, for example silver or aluminum or metal alloys including silver or aluminum. These materials are coated, for example, by sputtering or vapor deposition, and are patterned on display or touch-screen substrates, such as glass. For example, the use of transparent conductive oxides to form arrays of touch sensors on one side of a substrate is taught in U.S. Patent Application Publication No. 2011/0099805 entitled "Method of Fabricating Capacitive Touch-Screen Panel".

Transparent conductive metal oxides are increasingly expensive and relatively costly to deposit and pattern. Moreover, the substrate materials are limited by the electrode material deposition process (e.g. sputtering) and the current-carrying capacity of such electrodes is limited, thereby limiting the amount of power that can be supplied to the pixel elements. Although thicker layers of metal oxides or metals increase conductivity, they also reduce the transparency of the electrodes.

Transparent electrodes including very fine patterns of conductive elements, such as metal wires or conductive traces are known. For example, U.S. Patent Application Publication No. 2011/0007011 teaches a capacitive touch screen with a mesh electrode, as do U.S. Patent Application Publication No. 2010/0026664, U.S. Patent Application Publication No. 2010/0328248, and U.S. Pat. No. 8,179,381, which are hereby incorporated in their entirety by reference. As disclosed in U.S. Pat. No. 8,179,381, fine conductor patterns are made by one of several processes, including laser-cured masking, inkjet printing, gravure printing, micro-replication, and micro-contact printing. In particular, micro-replication is used to form micro-conductors formed in micro-replicated channels. The transparent micro-wire electrodes include micro-wires between $0.5\mu$ and $4\mu$ wide and a transparency of between approximately 86% and 96%.

Conductive micro-wires can be formed in micro-channels embossed in a substrate, for example as taught in CN102063951, which is hereby incorporated by reference in its entirety. As discussed in CN102063951, a pattern of micro-channels is formed in a substrate using an embossing technique. Embossing methods are generally known in the prior art and typically include coating a curable liquid, such as a polymer, onto a rigid substrate. A pattern of micro-channels is imprinted (impressed or embossed) onto the polymer layer by a master having an inverted pattern of structures formed on its surface. The polymer is then cured. A conductive ink is coated over the substrate and into the micro-channels, the excess conductive ink between micro-channels is removed, for example by mechanical buffing, patterned chemical electrolysis, or patterned chemical corrosion. The conductive ink in the micro-channels is cured, for example by heating. In an alternative method described in CN102063951, a photosensitive layer, chemical plating, or sputtering is used to pattern conductors, for example, using patterned radiation exposure or physical masks. Unwanted material (e.g. photosensitive resist) is removed, followed by electro-deposition of metallic ions in a bath.

Conductive micro-wires are used to form a touch switch, for example, as illustrated in U.S. Patent Application Publication No. 2011/0102370. In this example, a capacitive touch switch includes a first substrate on which is formed a first mesh-like electrode and a second substrate on which is formed a second mesh-like electrode. The first and second substrates are integrally bonded via an adhesive layer in such a manner that the first and second mesh-like electrodes face each other. Such a design requires the use of two substrates that are aligned and bonded together.

Multi-level masks are used with photo-lithography to form thin-film devices, for example as disclosed in U.S. Pat. No. 7,202,179. An imprinted 3D template structure is provided over multiple thin films formed on a substrate. The multiple levels of the template structure are used as masks for etching the thin films. This approach requires the use of a mask and multiple photo-lithographic steps.

The use of integrated circuits with electrical circuitry is well known. Various methods for providing integrated circuits on a substrate and electrically connecting them are also known. Integrated circuits can have a variety of sizes and packages. In one technique, Matsumura et al., in U.S. Patent Application Publication No. 2006/0055864, describes crystalline silicon substrates used for driving LCD displays. The application describes a method for selectively transferring and affixing pixel-control devices made from first semiconductor substrates onto a second planar display substrate. Wiring interconnections within the pixel-control device and connections from busses and control electrodes to the pixel-control device are shown.

Printed circuit boards are well known for electrically interconnecting integrated circuits and often include multiple layers of conductors with vias for electrically connecting conductors in different layers. Circuit boards are often made by etching conductive layers deposited on laminated fiberglass substrates. However, such etching processes are expensive and the substrates are not transparent and therefore of limited use in applications for which transparency is important, for example display and touch-screen applications.

Flexible substrates are also known in the art and are used with other devices, such as displays. U.S. Pat. No. 6,501,528 discloses a stacked display device with a folded substrate. U.S. Pat. No. 7,792,558 describes a mobile communication device with bent connector wires and U.S. Pat. No. 8,017,884 illustrates an integrated touch panel and electronic device. U.S. Pat. No. 5,520,112 describes a folded substrate and a dual-sided printing process. Such substrates, structures, and methods demonstrate an on-going need in the industry for manufacturing methods incorporating devices and flexible substrates.

SUMMARY OF THE INVENTION

There is a need, therefore, for further improvements in conductive structures for transparent electrodes and electrical controllers that enable simplified manufacturing processes and fewer parts and processing steps at a lower cost.

In accordance with the present invention, a method of making a micro-wire circuit structure adapted for wrapping comprises:

providing a flexible substrate having a touch portion, an edge portion, and a circuit portion on a common side of the flexible substrate, the edge portion located between the touch portion and the circuit portion;

forming a plurality of electrically conductive micro-wires on, in, or adjacent to the common side of the flexible substrate in the touch portion, the edge portion, and the circuit portion in common steps using common materials, one or more of the micro-wires extending from the touch portion, through the edge portion, and into the circuit portion; and locating one or more electrical circuits on or in the circuit portion and electrically connecting the one or more electrical circuits to corresponding extended micro-wires.

In further embodiments, the method includes providing a display, the display having a display viewing side, a display back side opposite the display viewing side, and a display edge and locating the flexible substrate in relation to the display with the touch portion located adjacent to the display viewing side, the circuit portion located adjacent to the display back side, and the edge portion wrapping around the display edge from the display viewing side to the display back side.

The present invention provides micro-wire structures with improved connectivity, computing capability, transparency, and manufacturability. The micro-wire structures of the present invention are particularly useful in transparent touch screens or display devices. The integration of an electrode portion and a circuit portion on a common side of a single flexible substrate reduces the number of parts and manufacturing steps, thereby reducing costs. Furthermore, by using both circuits and electrodes, the number of electrical connections needed to operate the device is reduced, improving integration and providing a simpler control structure.

BRIEF DESCRIPTION OF THE DRAWINGS

The above and other features and advantages of the present invention will become more apparent when taken in conjunction with the following description and drawings wherein identical reference numerals have been used to designate identical features that are common to the figures, and wherein:

FIG. 3B is a cross section illustrating an embodiment of the present invention corresponding to FIG. 3A;

The Figures are not drawn to scale since the variation in size of various elements in the Figures is too great to permit depiction to scale.

DETAILED DESCRIPTION OF THE INVENTION

The present invention is directed toward a micro-wire circuit structure adapted for wrapping. The micro-wire circuit structure includes a single flexible substrate having both apparently transparent micro-wire electrodes and an electronic circuit for controlling the transparent micro-wire electrodes on a common side of the flexible substrate. The single flexible substrate is wrapped around a display so that a portion of the flexible substrate having the transparent electrodes is located adjacent to a viewing side of a display and a portion of the flexible substrate having the electronic circuit is located on a back side of the display opposite the viewing side.

Figure 1A:
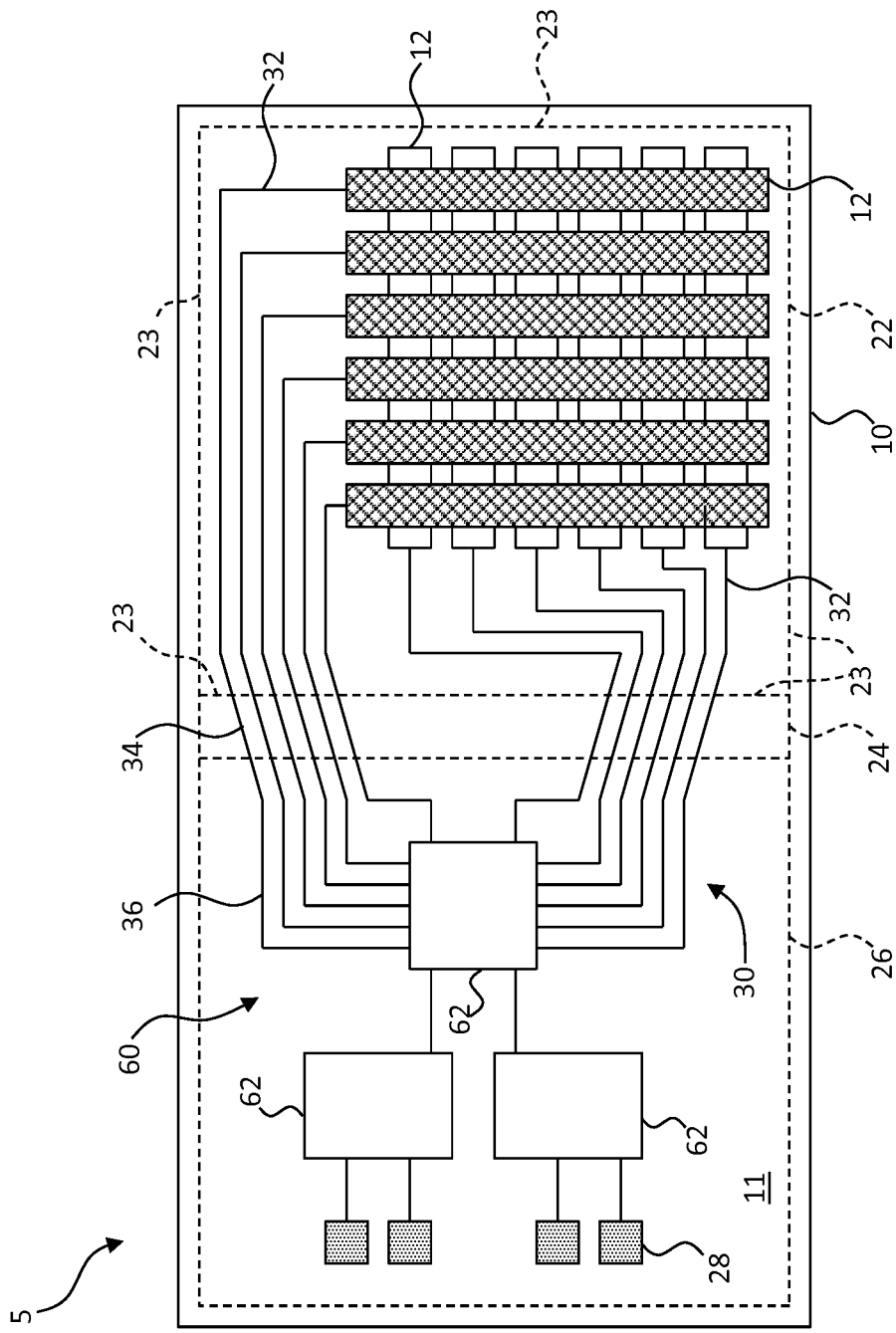
FIG. 1A is a plan view of an embodiment of the present invention having a single circuit portion.
Figure 1B:
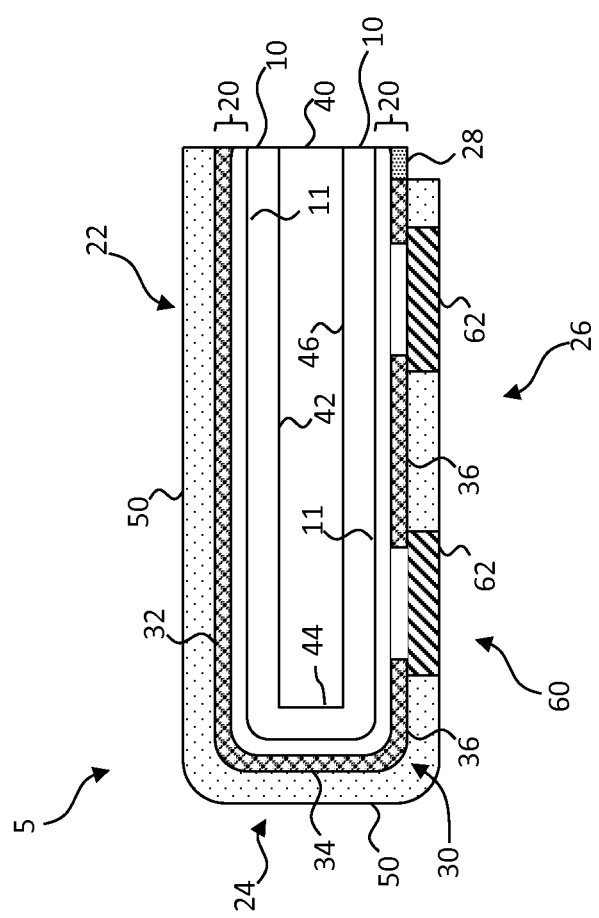
FIG. 1B is a cross section illustrating an embodiment of the present invention corresponding to FIG. 1A.

FIG. 1A is a plan view of a micro-wire circuit structure 5 in an unwrapped configuration according to an embodiment of the present invention. In FIG. 1B, according to another embodiment of the present invention, a corresponding cross section of the micro-wire circuit structure 5 includes a display 40 having a display viewing side 42, a display edge side 44, and a display back side 46 opposite the display viewing side 42. A flexible substrate 10 is wrapped around the display edge side 44 of the display 40. Throughout this specification, the term "flexible substrate" indicates that the flexible substrate 10 is adapted for wrapping, for example wrapping around a display, another substrate, or a structure. In an embodiment, the flexible substrate 10 is transparent, for example greater than 70% transparent to visible light. As shown in FIG. 1A or 1B, the flexible substrate 10 includes a touch portion 22, an edge portion 24, and a circuit portion 26 on a common substrate side 11 of the flexible substrate 10. The edge portion 24 is located between the touch portion 22 and the circuit portion 26 along the common substrate side 11 of the flexible substrate 10.

A plurality of micro-wires 30 are located on, in, or adjacent to the common substrate side 11 in the touch portion 22, the edge portion 24, and the circuit portion 26. The micro-wires 30 are any electrical conductors too small to be resolved by the unaided human visual system at a desired viewing distance. A touch micro-wire 32 is a micro-wire 30 that is in the touch portion 22 or is a portion of the micro-wire 30 in the touch portion 22. The edge micro-wire 34 is a micro-wire 30 that is in the edge portion 24 or is a portion of the micro-wire 30 in the edge portion 24. A circuit micro-wire 36 is a micro-wire 30 that is in the circuit portion 26 or is a portion of the micro-wire 30 in the circuit portion 26. Thus, the micro-wire 30 can be only the touch micro-wire 32, the edge micro-wire 34, or the circuit micro-wire 36. Alternatively, the micro-wire 30 can include contiguous portions that are a combination of the touch micro-wire 32, the edge micro-wire 34, or the circuit micro-wire 36. One or more of the micro-wires 30 is an extended micro-wire 30 that extends from the touch portion 22, through the edge portion 24, and into the circuit portion 26 and thus includes a portion that is the touch micro-wire 32, the edge micro-wire 34, and the circuit micro-wire 36.

One or more electrical circuits 60 is located on or in the circuit portion 26 and is electrically connected to corresponding extended micro-wires 30. In the wrapped configuration of FIG. 1B, the flexible substrate 10 is located in relation to the display 40 with the touch portion 22 located adjacent to the display viewing side 42, the circuit portion 26 is located adjacent to the display back side 46, and the edge portion 24 wraps around the display edge side 44 from the display viewing side 42 to the display back side 46. The electrical circuit 60 can include one or more connection pads 28 to which external electrical power or signals are applied. In an embodiment, the connection pads 28 are located in the periphery of the circuit portion 26 for ready access to external connectors providing electrical power or signals.

In an embodiment of the present invention, the micro-wires 30 in the touch portion 22 form apparently transparent micro-wire electrodes 12 or an array of apparently transparent micro-wire electrodes 12. In a further embodiment, the micro-wires 30 are a part of the electrical circuit 60 in the circuit portion 26. In an embodiment, the electrical circuit 60 includes integrated circuits 62 having a separate substrate from the flexible substrate 10 or circuits printed or otherwise formed on the flexible substrate 10 or the micro-wire layer 20 to control the transparent micro-wire electrodes 12. Alternatively, the electrical circuit 60 can include organic or inorganic active powered components or inactive components.

In an arrangement, the micro-wires 30 are formed in a micro-wire layer 20. The micro-wire layer 20 can include a pattern of micro-wires 30, for example formed on the common substrate side 11 by inkjet printing, flexographic printing, or gravure printing conductive inks that are then cured to form micro-wires 30, or by pattern-wise etching a coated conductive layer. Alternatively, the micro-wires 30 are formed in the cured micro-wire layer 20 with a pattern of imprinted micro-channels filled with a cured conductive material on the common substrate side 11.

According to various embodiments of the present invention, the display 40 is any display for displaying information that has the display viewing side 22, the display back side 26 opposite the display viewing side 22, and the display edge side 24, for example a liquid crystal display, an organic light-emitting diode display, a plasma display, or an electrophoretic display. The flexible substrate 10 is any substrate on which the micro-wires 30 can be located and that can be wrapped around the display 40 display edge side 44 at least once. The flexible substrate 10 is not necessarily compliant or capable of returning to a previous configuration when wrapped or being wrapped multiple times.

In a further embodiment of the present invention, a protective layer 50 is located on the micro-wires 30 in the edge portion 24 and, optionally, in the touch portion 22 (FIG. 1B). In the touch portion 22, the protective layer 50 can protect the micro-wires 30 and, in the edge portion 24, the protective layer 50 can also reduce strain in the micro-wires 30 resulting from wrapping the flexible substrate 10 around the display edge side 44 of the display 40, mitigating stress and preserving conductivity in the micro-wires 30. To further mitigate stress in the micro-wire layer 20, in an embodiment the protective layer 50 has a thickness that is equal to or greater than the flexible substrate 10, has a thickness that is equal to or greater than the micro-wire layer 20, or has a thickness that is equal to or greater than the flexible substrate 10 and the micro-wire layer 20 combined.

In yet another embodiment, the protective layer 50 is a polarizer. Such a polarizer can polarize light reflected from or emitted by the display 40, for example to reduce reflections or glare from the display viewing side 42 or to polarize light emitted from the display 40, as is done for liquid crystal displays or organic light-emitting diodes. In an embodiment, the polarizer is a linear polarizer or is part of a circular polarizer.

In a further embodiment, the touch portion 22 has a touch-portion edge 23 and the extended micro-wires 30 extending through the edge portion 24 extend in a direction that is non-orthogonal to the touch-portion edge 23 (FIG. 1A). By arranging the micro-wires 30 non-orthogonally to the touch-portion edge 23, stress in the micro-wires 30 is mitigated and electrical conductivity preserved. In an embodiment, after the extended micro-wires 30 are wrapped, the edge micro-wires 34 that are the portion of the extended micro-wires 30 in the edge portion 24 are substantially in compression.

As shown in FIG. 1A, in an embodiment, the touch portion 22 is rectangular and has four touch-portion edges 23, one on each side of the rectangle. According to further embodiments and as illustrated in FIGS. 2A-2C, 3A-3B, 4A-4B, and 5A-5B, the flexible substrate 10 further includes a plurality of circuit portions 26 and edge portions 24 located between the touch portion 22 and the corresponding circuit portion 26.

Figure 2A:
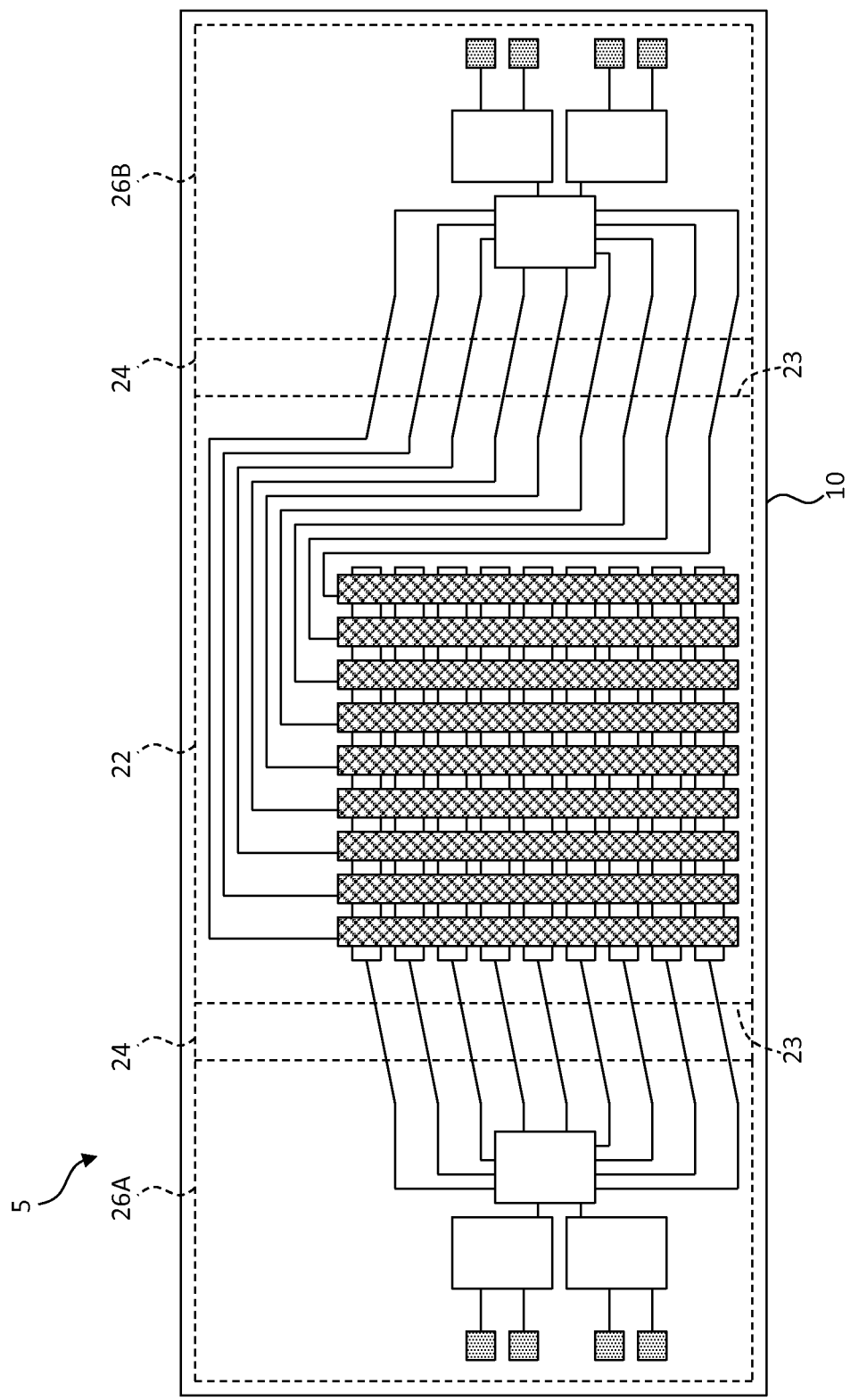
FIG. 2A is a plan view of an embodiment of the present invention having two opposing circuit portions.

Referring next to FIG. 2A, in an embodiment of the wrap-around micro-wire circuit structure 5 of the present invention, the flexible substrate 10 includes the touch portion 22 with two touch-portion edges 23 on opposite sides of the touch portion 22. Two edge portions 24 are located on opposite sides of the touch portion 22 and first and second circuit portions 26A, 26B are each adjacent to the edge portion 24. As illustrated in the corresponding cross section of FIG. 2B, the flexible substrate 10 is wrapped around the display 40 and the first circuit portions 26A is adhered to the display back side 46 and the second circuit portion 26B does not overlap the one circuit portion 26A. The second circuit portion 26B can also be adhered to the display back side 46. In the alternative embodiment of FIG. 2C, the first circuit portion 26A is adhered to the display back side 46 with an adhesive (not shown) and the second circuit portion 26B wraps around the display edge side 44 of the display 40 and overlaps the first circuit portion 26A. The second circuit portion 26B is adhered to the first circuit portion 26A with an adhesive 14.

Figure 2B:
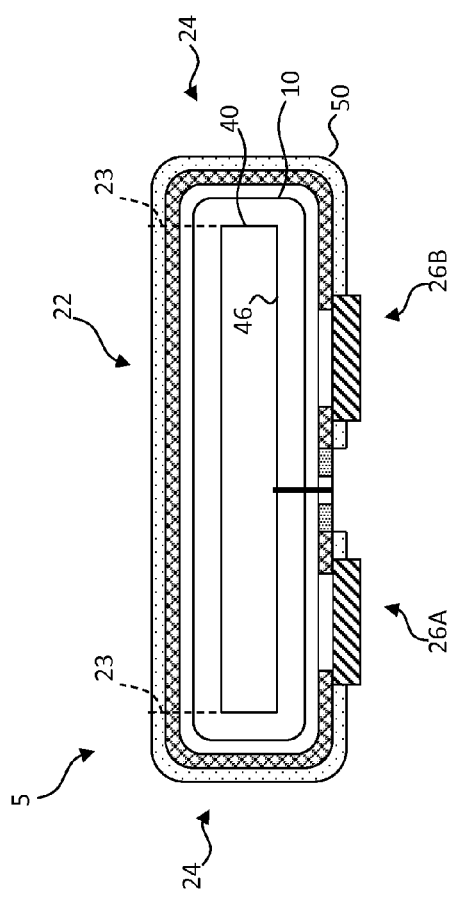
FIGS. 2B and 2C are cross sections illustrating embodiments of the present invention corresponding to FIG. 2A.
Figure 3A:
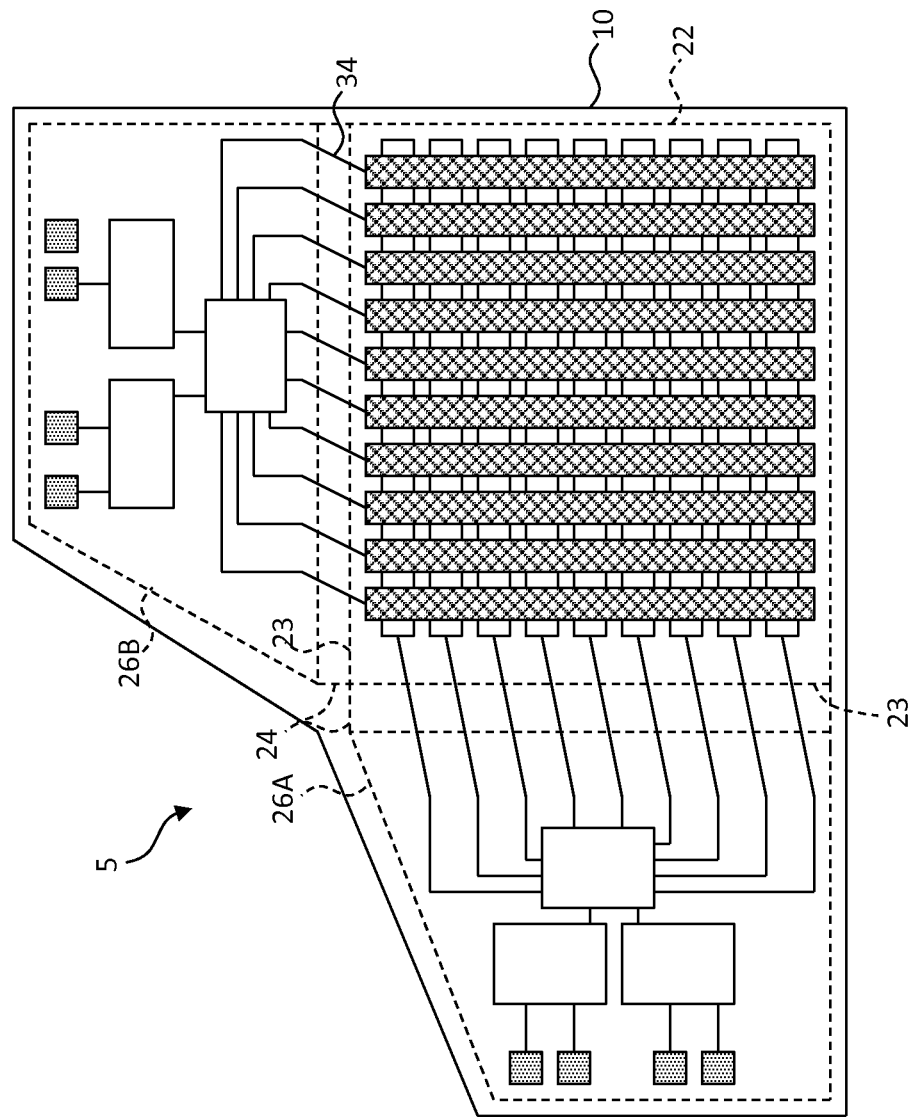
FIG. 3A is a plan view of an embodiment of the present invention having two adjacent circuit portions.

Referring next to FIGS. 3A and 3B in an embodiment of the wrap-around micro-wire circuit structure 5, the flexible substrate 10 includes the touch portion 22 having two touch-portion edges 23 on adjacent sides of the touch portion 22. Two edge portions 24 are located adjacent to the touch-portion edges 23 of the touch portion 22 and corresponding first and second circuit portions 26A, 26B are each adjacent to an edge portion 24. This is similar to the arrangements of FIGS. 2A and 2B but with the flexible substrate 10 wrapped around adjacent edge portions 24 rather than edge portions 24 on opposite sides of the touch portion 22 so that in a cross sectional view only one wrapped edge is visible. As shown in FIG. 3B, the first circuit portion 26A of the flexible substrate 10 wraps around the display edge side 44 and is adhered to the display back side 46 with an adhesive (not shown). The edge portion 24 of the second circuit portion 26B that wraps around the display edge side 44 of the display 40 is not visible in the cross section. The second circuit portion 26B is adhered to the first circuit portion 26A with adhesive 14. Protective layer 50 protects the micro-wires 30.

Figure 4A:
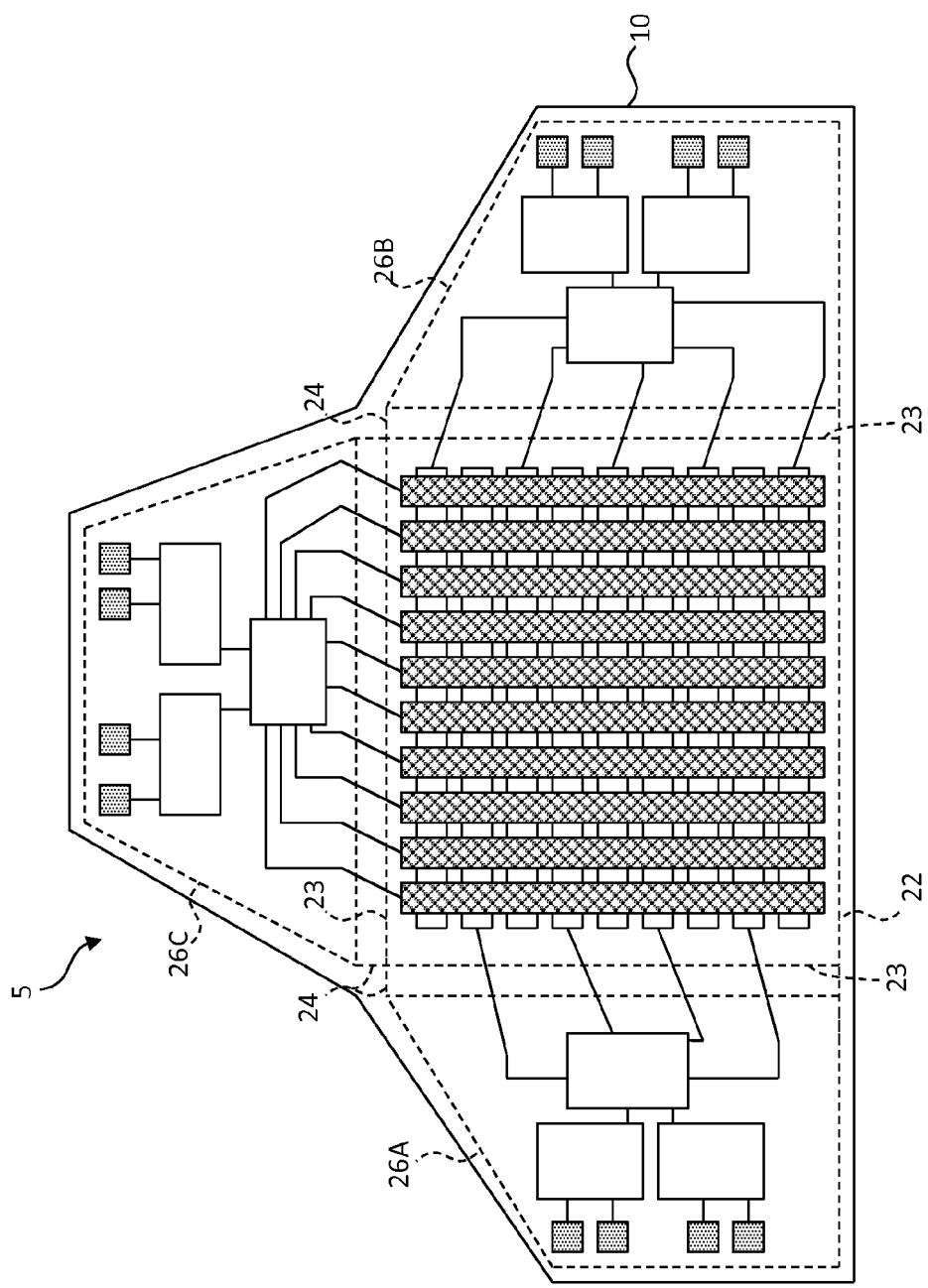
FIG. 4A is a plan view of an embodiment of the present invention having three adjacent circuit portions.
Figure 4B:
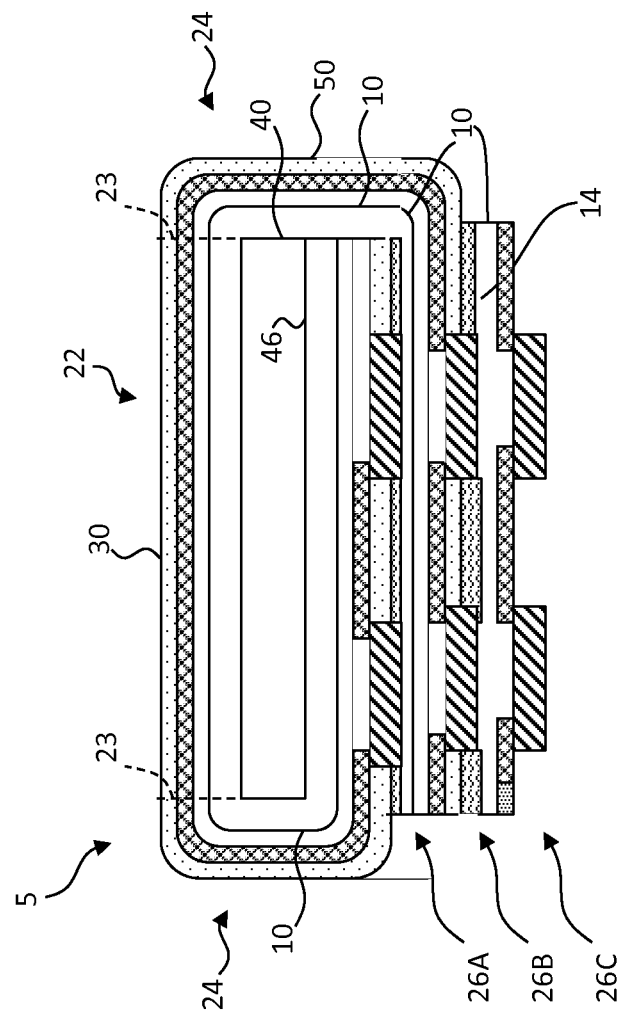
FIG. 4B is a cross section illustrating an embodiment of the present invention corresponding to FIG. 4A.

As shown in FIGS. 4A and 4B in another embodiment of the wrap-around micro-wire circuit structure 5, the flexible substrate 10 includes the touch portion 22 having three touch-portion edges 23 of the touch portion 22, each with an edge portion 24 and corresponding first and second circuit portions 26A, 26B and a third circuit portion 26C each adjacent to an edge portion 24. In further embodiments, the flexible substrate 10 of FIG. 4A is wrapped around the display 40 (for example as shown in FIG. 2B) and the first, second, and third circuit portions 26A, 26B, 26C are adhered to the display back side 46 without overlapping. Alternatively, as shown in FIG. 4B, the third circuit portion 26C overlaps the second circuit portion 26B that overlaps the first circuit portion 26A. The first, second, and third circuit portions 26A, 26B, 26C are adhered together with adhesive 14. Protective layer 50 protects the micro-wires 30.

Figure 5A:
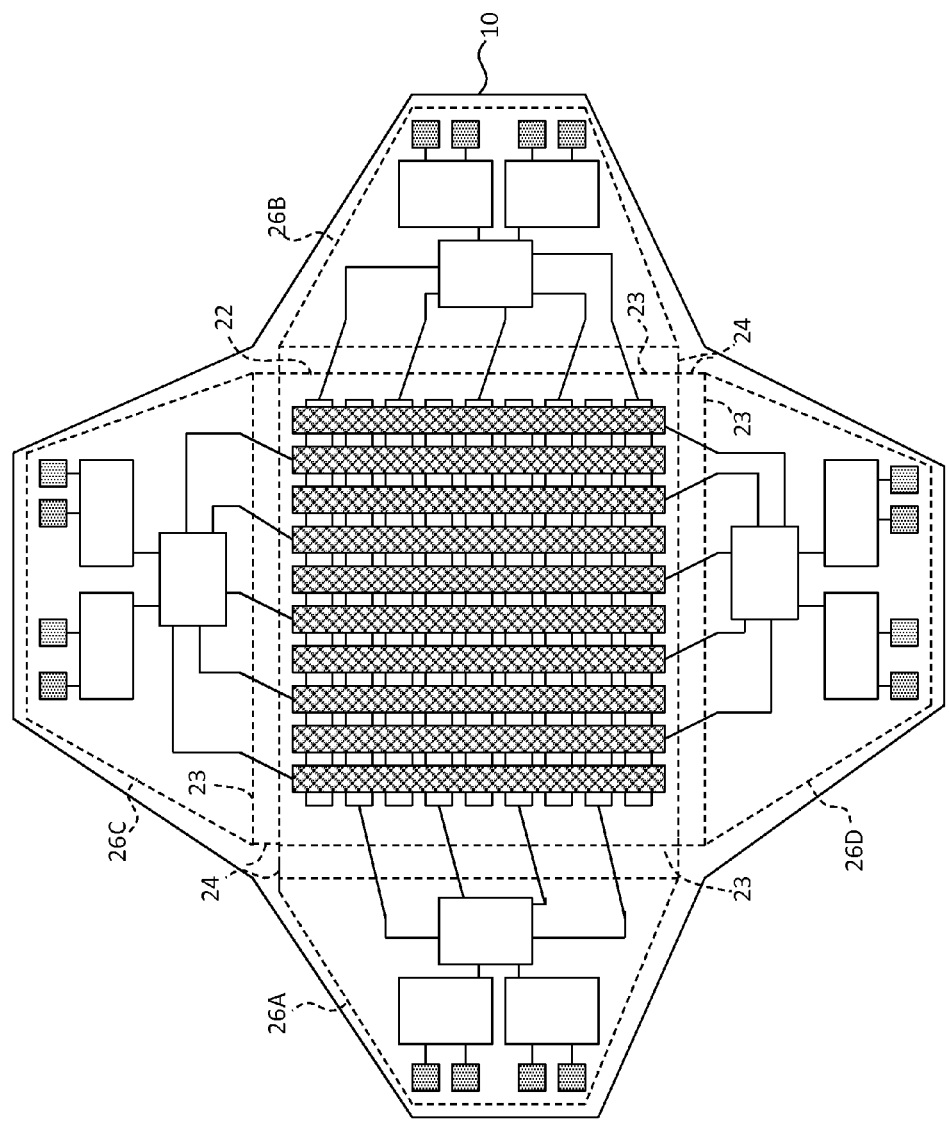
FIG. 5A is a plan view of an embodiment of the present invention having four circuit portions.
Figure 5B:
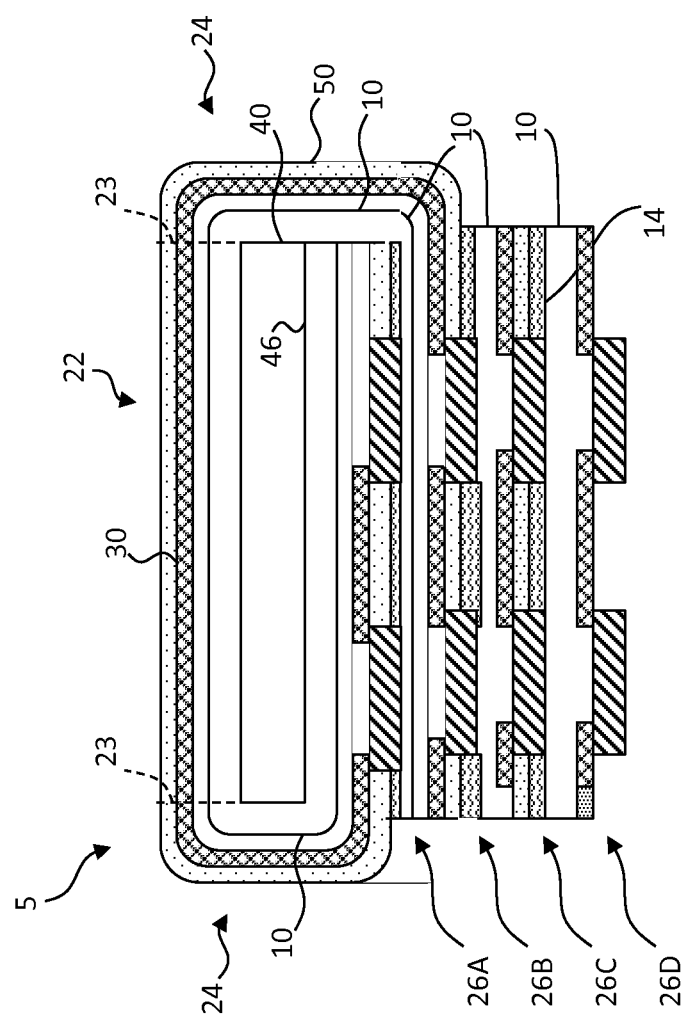
FIG. 5B is a cross section illustrating an embodiment of the present invention corresponding to FIG. 5A.

In yet another embodiment of the wrap-around micro-wire circuit structure 5 shown in FIGS. 5A and 5B, the flexible substrate 10 includes the touch portion 22 with four touch-portion edges 23, an edge portion 24 adjacent to each of the touch-portion edges 23, and first, second, and third circuit portions 26A, 26B, 26C, and a fourth circuit portion 26D are each adjacent to an edge portion 24. In further embodiments (not shown), the flexible substrate 10 of FIG. 5A is wrapped around the display 40 and the first, second, third, and fourth circuit portions 26A, 26B, 26C, 26D are adhered to the display back side 46 without overlapping. Alternatively, as shown in FIG. 5B, the fourth circuit portion 26D overlaps the third circuit portion 26C that overlaps the second circuit portion 26B that overlaps the first circuit portion 26A. The first, second, third, and fourth circuit portions 26A, 26B, 26C, 26D are adhered together with adhesive 14. Protective layer 50 protects the micro-wires 30.

Figure 6:
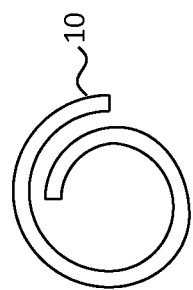
FIG. 6 is an end view of an embodiment of the present invention illustrating a rolled configuration.

Referring to the embodiment of FIG. 6, the flexible substrate 10 is rolled or spindled to arrange the flexible substrate 10 in a rolled configuration. If the display 40 is provided as the flexible display 40, in an embodiment the display 40 is rolled with the flexible substrate 10. Thus, the wrap-around micro-wire circuit structure 5 is stored in a reduced or more convenient volume.

Figure 7:
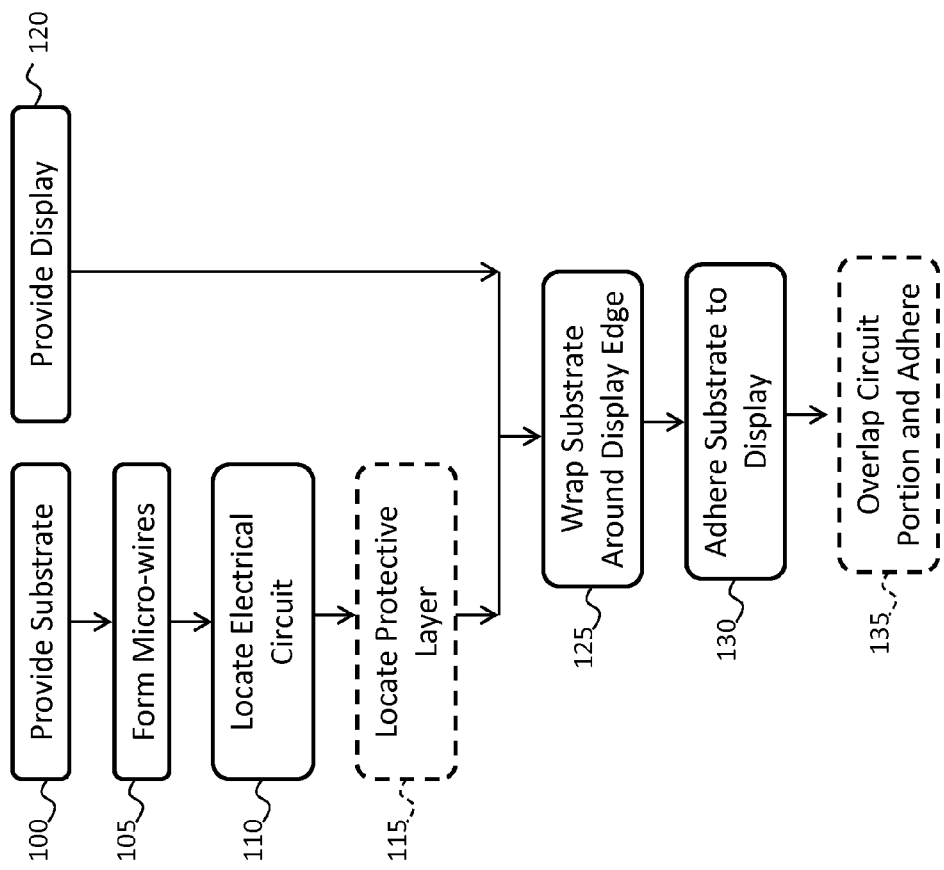
FIGS. 7-8 are flow diagrams illustrating various methods of the present invention.

The wrap-around micro-wire circuit structure 5 of the present invention can implement a touch screen that is useful in forming a display and touch-screen system. The touch portion 22 of the flexible substrate 10 is located adjacent to the display viewing side 42 of the display 40 so that users can see the display 40 through the touch portion 22 and physically touch the touch portion 22 to interact with the display and touch screen system. The micro-wires 30 in the transparent micro-wire electrode 12 in the touch portion 22 are not resolved by the unaided human visual system at a designed viewing distance so that the touch portion 22 is apparently transparent. The transparent micro-wire electrodes 12 provide the electrical infrastructure to enable a capacitive touch screen controlled by a touch-screen controller. Referring to FIG. 7, a method of making a wrap-around micro-wire circuit structure 5 includes providing the flexible substrate 10 having the touch portion 22, the edge portion 24, and the circuit portion 26 on a common side 11 of the flexible substrate 10 in step 100. The edge portion 24 is located between the touch portion 22 and the circuit portion 26. A plurality of electrically conductive micro-wires 30 is formed on, in, or adjacent to the common side 11 of the flexible substrate 10 in the touch portion 22, the edge portion 24, and the circuit portion 26 in a common step 105 using common materials. One or more of the micro-wires 30 is an extended micro-wire 30 that extends from the touch portion 22, through the edge portion 24, and into the circuit portion 26. In an embodiment, the micro-wires 30 are formed to extend through the edge portion 24 in a direction that is non-orthogonal to the touch-portion edge 23. One or more electrical circuits 60 is formed in step 110 on or in the circuit portion 26 and electrically connected to corresponding extended micro-wires 30 and can include integrated circuits 62.

An optional protective layer 50 is located on the micro-wires 30 in step 115, for example by laminating or coating a layer over the flexible substrate 10. The protective layer 50 can have a thickness that is equal to or greater than a thickness of the flexible substrate 10. The protective layer 50 can be a common layer that extends over both the edge portion 24 and the touch portion 22 and, optionally, the circuit portion 26. In an embodiment, the protective layer 50 is provided after the electrical circuit 60 is constructed and any connections made to the connection pads 28 and before the micro-wire circuit structure 5 is wrapped around the display 40.

The display 40 is provided in step 120 and the flexible substrate 10 is wrapped around the display edge side 44 in step 125 so that the flexible substrate 10 is located in relation to the display 40 with the touch portion 22 located adjacent to the display viewing side 42, the circuit portion 26 located adjacent to the display back side 46, and the edge portion 24 wrapping around the display edge side 44 from the display viewing side 42 to the display back side 46. The step 125 can include cutting the flexible substrate 10 from a web. Thus, in an embodiment, the flexible substrate 10 is provided or arranged in a flat configuration, the flexible substrate 10 is processed to form the micro-wires 30 while the flexible substrate 10 is in the flat configuration, and then the flexible substrate 10 is bent or curved to locate the flexible substrate 10 in relation to the display 40.

Figure 2C:
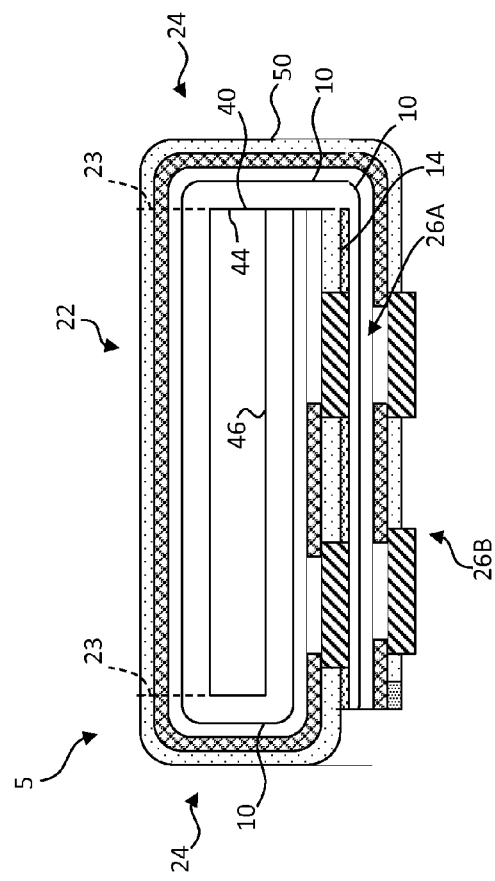

In step 130, a side of the flexible substrate 10 opposite the common side 11 is adhered to the display, for example the touch portion 22 is adhered to the display viewing side 42, the edge portion 24 is adhered to the display edge side 44, or the circuit portion 26 is adhered to the display back side 46. Additionally, in an embodiment the remaining circuit portion 26A is overlapped with, and optionally adhered to, the one circuit portion 26A in step 135 (FIG. 2C). In an optional step, the flexible substrate 10 is rolled up into a rolled configuration or carried in a cylinder (FIG. 6).

By forming the micro-wires 30 of the circuit portion 26, the edge portion 24, and the touch portion 22 on a common substrate side 11 of the flexible substrate 10 in a common step with common materials, manufacturing steps, parts, and costs are reduced. Fewer connective cables are required and fewer substrates needed. Furthermore, the use of integrated circuits 62 in the electrical circuit 60 in the circuit portion 26 supports a more functionally capable micro-wire circuit structure 5 and reduces the interconnection needs for operating the touch screen. In particular, the integrated circuits 62 can include a touch-screen controller. The protective layer 50 and the edge micro-wires 34 formed at an angle to an edge of the display 40 provide structural robustness so that the edge micro-wires 34 do not break when the flexible substrate 10 is wrapped around the display 40.

In an embodiment, the micro-wires 30 or electrical circuits 60 are printed on the flexible substrate 10, for example by gravure printing, offset printing, flexographic printing, or inkjet printing. A patterned stamp, or printing plate, is provided and coated with a conductive ink, and the conductive ink is printed on the common side of the flexible substrate. In another embodiment, the conductive ink is printed with an inkjet printer or the electrical circuits 60 are printed on the flexible substrate 10 or the micro-wire layer 20. Alternatively, the electrical circuits 60 are integrated circuits 62 that are affixed to the flexible substrate 10 and the micro-wires 30 are used to electrically connect the integrated circuits 62. The integrated circuits 62 are affixed to the flexible substrate 10 either before or after the flexible substrate 10 is located in relation to the display 40. Methods for affixing integrated circuits to the flexible substrate 10 or micro-wire layer 20 are known in the circuit board manufacturing arts.

Figure 8:
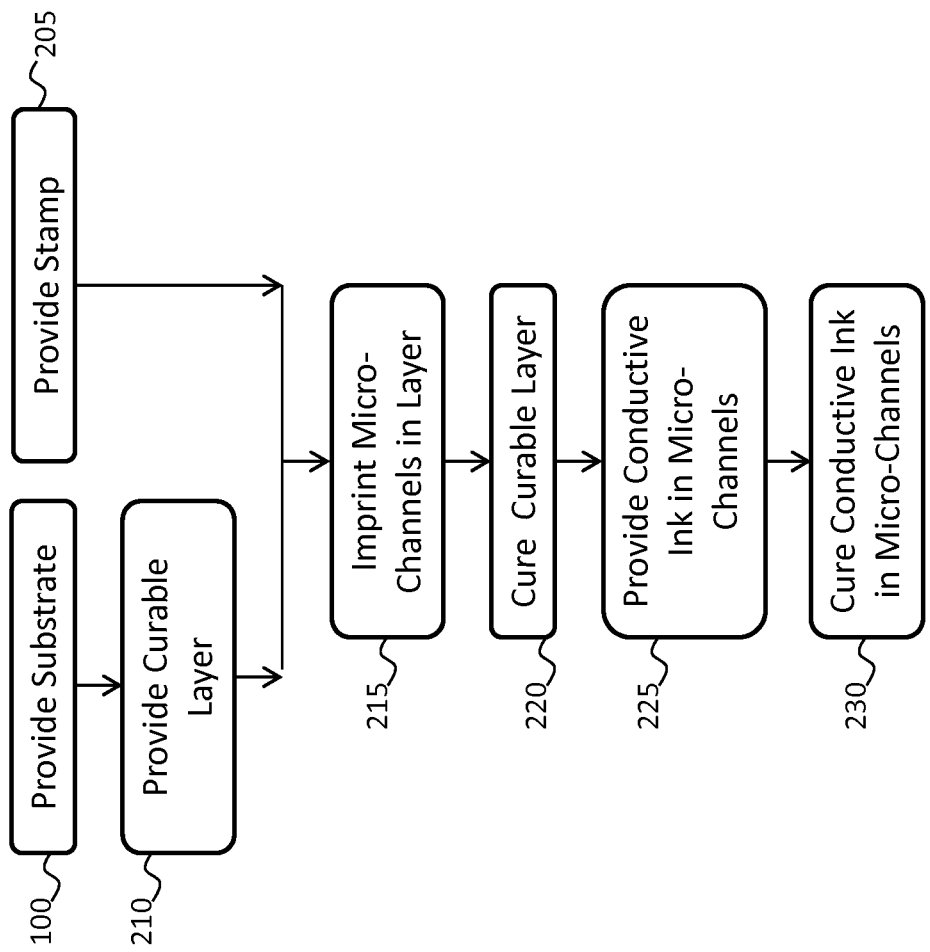

In another embodiment, referring to FIG. 8, the flexible substrate 10 is provided in step 100 and a stamp provided in step 205 and a curable layer is laminated or coated on the common substrate side 11 of the flexible substrate 10 in step 210. The curable layer can be a polymer or resin layer that includes cross linking elements activated by heat or radiation to form a cured layer. The curable layer is imprinted in step 215 to form micro-channels in the uncured layer. The uncured layer is cured in step 220 to form a cured layer, for example the micro-wire layer 20, with embedded micro-channels. The cured layer and micro-channels are coated in step 225 with a conductive ink and the conductive ink is removed from the surface of the cured layer leaving the conductive ink in the micro-channels. The conductive ink is cured in step 230 to form micro-wires 30 in the micro-channels.

In further embodiments of the present invention wherein the touch portion 22 has a plurality of touch-portion edges 23, the flexible substrate 10 further includes a plurality of circuit portions 26 and edge portions 24, and each edge portion 24 is located between a corresponding touch-portion edge 23 and a corresponding circuit portion 26, a method of the present invention further includes locating the flexible substrate 10 in relation to the display 40 with the touch portion 22 located adjacent to the display viewing side 42 and each edge portion 24 wrapping around the display 40 from the display viewing side 42 to the display back side 44. Furthermore, other methods include adhering one of the circuit portions 26 to the display back side 46 and overlapping the remaining circuit portions 26 over the one circuit portion 26. Alternatively, each of the circuit portions 26 is adhered to a different portion of the display back side 46 without overlapping the circuit portions 26. In an embodiment, the micro-wires 30 in the touch portion 22, the plurality of edge portions 24, and the plurality of circuit portions 26 are formed in a common step with common materials.

Imprinted structures are also known to those skilled in the art as embossed or impressed structures formed by locating in a curable layer an imprinting, impressing, or embossing stamp having protruding structural features, curing the layer, and then removing the stamp to form micro-channels corresponding to the structural features that are then filled with a conductive ink that is cured to form micro-wires.

The flexible substrate 10 is any substrate that can be bent at least once and that has a surface on which the micro-wire layer 20 can be formed. In an embodiment, the flexible substrate 10 is a plastic or polymer material, can be transparent, and can have opposing substantially parallel and extensive surfaces, and additional layers. In various embodiments, the flexible substrate 10 is transparent, for example transmitting 50%, 80%, 90%, 95% or more of visible light and is rigid or flexible. The flexible substrates 10 can include a dielectric material useful for capacitive touch screens and can have a wide variety of thicknesses, for example 10 microns, 50 microns, 100 microns, 1 mm, or more.

In an embodiment, the cured micro-wire layer 20 is a layer of curable material that has been cured and, for example, formed of a curable material coated or otherwise deposited on a surface, for example a surface of the flexible substrate 10, to form a curable layer. The substrate-coated curable material is considered herein to be curable layer before it is cured and a cured layer after it is cured. Similarly, a cured electrical conductor is an electrical conductor formed by locating a curable material in a micro-channel and curing the curable material to form the cured electrical conductor in the micro-channel. The cured electrical conductor is a micro-wire 30.

In various embodiments, curable layers are deposited as a single layer in a single step using coating methods known in the art, e.g. curtain coating. In an alternative embodiment, curable layers are deposited as multiple sub-layers using multi-level deposition methods known in the art, e.g. multi-level slot coating, repeated curtain coatings, or multi-level extrusion coating. In yet another embodiment, curable layers include multiple sub-layers formed in different, separate steps, for example with a multi-level extrusion, curtain coating, or slot coating as is known in the coating arts. Micro-channels are embossed and cured in curable layers in a single step and micro-wires are formed by depositing a curable conductive ink in micro-channels and curing the curable conductive ink to form an electrically conductive micro-wire.

Cured layers useful in the present invention can include a cured polymer material with cross-linking agents that are sensitive to heat or radiation, for example infra-red, visible light, or ultra-violet radiation. The polymer material can be a curable material applied in a liquid form that hardens when the cross-linking agents are activated, for example with exposure to radiation or heat. When a molding device, such as a stamp having an inverse micro-channel structure is applied to liquid curable material in a curable layer coated on the flexible substrate 10 and the cross-linking agents in the curable material are activated, the liquid curable material in the curable layer is hardened into a cured layer having micro-channels with the inverse structure of the stamp. The liquid curable materials can include a surfactant to assist in controlling coating. Materials, tools, and methods are known for embossing coated liquid curable materials to form cured layers having conventional single-layer micro-channels.

Similarly, curable inks useful in the present invention are known and can include conductive inks having electrically conductive nano-particles, such as silver nano-particles. The electrically conductive nano-particles can be metallic or have an electrically conductive shell. The electrically conductive nano-particles can be silver, can be a silver alloy, or can include silver.

Curable inks provided in a liquid form are deposited or located in micro-channels and cured, for example by heating or exposure to radiation such as infra-red, visible light, or ultra-violet radiation. The curable ink hardens to form the cured ink that makes up micro-wires. For example, a curable conductive ink with conductive nano-particles is located within micro-channels and heated to agglomerate or sinter the nano-particles, thereby forming an electrically conductive micro-wire. Materials, tools, and methods are known for coating liquid curable inks to form the micro-wires 30 in conventional single-layer micro-channels. The curable conductive ink is not necessarily electrically conductive before it is cured.

It has been experimentally demonstrated that micro-channels having a width of four microns formed in a cured layer with a depth having a range of about four microns to twelve microns over a conductive layer can be filled with liquid curable conductive inks containing silver nano-particles and cured with heat to form the micro-wires 30 that conduct-electricity, thus enabling electrical conduction between separate micro-wires 30 in a cured micro-wire layer 20. It has also been demonstrated that a flexible substrate 10 having imprinted micro-wires 30 can be wrapped around a substrate while maintaining electrical conductivity of the micro-wires 30.

Electrically conductive micro-wires 30 and methods of the present invention are useful for making electrical conductors and busses for transparent micro-wire electrodes 12 and electrical conductors in general, for example as used in electrical busses. A variety of micro-wire or micro-channel patterns can be used and the present invention is not limited to any one pattern. The micro-wires 30 can be spaced apart, form separate electrical conductors, or intersect to form a mesh electrical conductor on or in a layer. Micro-channels can be identical or have different sizes, aspect ratios, or shapes. Similarly, the micro-wires 30 can be identical or have different sizes, aspect ratios, or shapes. Micro-wires 30 can be straight or curved.

In some embodiments, a micro-channel is a groove, trench, or channel formed in a cured layer and having a cross-sectional width less than 20 microns, for example 10 microns, 5 microns, 4 microns, 3 microns, 2 microns, 1 micron, or 0.5 microns, or less. In an embodiment, a micro-channel depth is comparable to a micro-channel width. Micro-channels can have a rectangular cross section. Other cross-sectional shapes, for example trapezoids, are known and are included in the present invention. The width or depth of a layer is measured in cross section.

In various embodiments, cured inks can include metal particles, for example nano-particles. The metal particles can be sintered to form a metallic electrical conductor. The metal nano-particles can be silver or a silver alloy or other metals, such as tin, tantalum, titanium, gold, copper, or aluminum, or alloys thereof. Cured inks can include light-absorbing materials such as carbon black, a dye, or a pigment.

In an embodiment, a curable ink can include conductive nano-particles in a liquid carrier (for example an aqueous solution including surfactants that reduce flocculation of metal particles, humectants, thickeners, adhesives or other active chemicals). The liquid carrier can be located in micro-channels and heated or dried to remove liquid carrier or treated with hydrochloric acid, leaving a porous assemblage of conductive particles that can be agglomerated or sintered to form a porous electrical conductor in a layer. Thus, in an embodiment, curable inks are processed to change their material compositions, for example conductive particles in a liquid carrier are not electrically conductive but after processing form an assemblage that is electrically conductive.

Once deposited, the conductive inks are cured, for example by heating. The curing process drives out the liquid carrier and sinters the metal particles to form a metallic electrical conductor. Conductive inks are known in the art and are commercially available. In any of these cases, conductive inks or other conducting materials are conductive after they are cured and any needed processing completed. Deposited materials are not necessarily electrically conductive before patterning or before curing. As used herein, a conductive ink is a material that is electrically conductive after any final processing is completed and the conductive ink is not necessarily conductive at any other point in the micro-wire formation process.

In an example and non-limiting embodiment of the present invention, each micro-wire is from 10 to 15 microns wide, from 5 to 10 microns wide, from one micron to five microns wide or from one/half micron to one micron wide. In some embodiments, micro-wires 30 can fill micro-channels; in other embodiments micro-wires 30 do not fill micro-channels. In an embodiment, micro-wires 30 are solid; in another embodiment micro-wires 30 are porous.

Micro-wires 30 can include metal, for example silver, gold, aluminum, nickel, tungsten, titanium, tin, or copper or various metal alloys including, for example silver, gold, aluminum, nickel, tungsten, titanium, tin, or copper. Micro-wires 30 can include a thin metal layer composed of highly conductive metals such as gold, silver, copper, or aluminum. Other conductive metals or materials can be used. Alternatively, micro-wires 30 can include cured or sintered metal particles such as nickel, tungsten, silver, gold, titanium, or tin or alloys such as nickel, tungsten, silver, gold, titanium, or tin. Conductive inks can be used to form micro-wires with pattern-wise deposition or pattern-wise formation followed by curing steps. Other materials or methods for forming micro-wires, such as curable ink powders including metallic nano-particles, can be employed and are included in the present invention.

Electrically conductive micro-wires 30 of the present invention can be operated by electrically connecting the micro-wires 30 through connection pads 28 and electrical connectors to electrical circuits that provide electrical current to the micro-wires 30 and can control the electrical behavior of the micro-wires 30. Electrically conductive micro-wires 30 of the present invention are useful, for example in touch screens such as projected-capacitive touch screens that use transparent micro-wire electrodes and in displays 40. Electrically conductive micro-wires 30 can be located in areas other than display areas, for example in the perimeter of the display area of a touch screen, where the display area is the area through which a user views a display 40.

In operation, electrically interconnected micro-wires 30 of the present invention are electrically controlled by a controller. Electrical signals are provided to any integrated circuits including those in the circuit portion 26 to process information, control sensors, or respond to sensors. Integrated circuits and electrical circuits are generally well known in the computing arts and can include circuits built on crystalline inorganic materials such as silicon or using organic materials that are formed on or in the flexible substrate 10 or micro-wire layer 20.

Methods and devices for forming and providing flexible substrates 10 and coating flexible substrates 10 are known in the photo-lithographic arts. Likewise, tools for laying out electrodes, conductive traces, and connectors are known in the electronics industry as are methods for manufacturing such electronic system elements. Hardware controllers for controlling touch screens and displays and software for managing display and touch screen systems are all well known. All of these tools and methods can be usefully employed to design, implement, construct, and operate the present invention. Methods, tools, and devices for operating capacitive touch screens can be used with the present invention.

The invention has been described in detail with particular reference to certain embodiments thereof, but it will be understood that variations and modifications can be effected within the spirit and scope of the invention.

PARTS LIST 5 micro-wire circuit structure
10 flexible substrate
11 common substrate side
12 micro-wire electrodes
14 adhesive
20 micro-wire layer
22 touch portion
23 touch portion edge
24 edge portion
26 circuit portion
26A first circuit portion
26B second circuit portion
26C third circuit portion
26D fourth circuit portion
28 connection pads
30 micro-wires
32 touch micro-wire
34 edge micro-wire
36 circuit micro-wire
40 display
42 display viewing side
44 display edge side
46 display back side
50 protective layer
60 electrical circuit
62 integrated circuit
100 provide substrate step
105 form micro-wires step
110 locate electrical circuit step
115 locate protective layer step
120 provide display step
125 wrap substrate around display step
130 adhere substrate to display step
135 overlap circuit portion and adhere step
205 provide stamp step
210 provide curable layer step
215 imprint micro-channels in curable layer step
220 cure curable layer step
225 provide conductive ink in micro-channels step
230 cure conductive ink in micro-channels step

The invention claimed is:

1. A method of making a micro-wire circuit structure adapted for wrapping, comprising:
providing a flexible substrate having a touch portion, a wrappable edge portion, and a circuit portion on a common side of the flexible substrate, the wrappable edge portion located between the touch portion and the circuit portion;
forming a plurality of electrically conductive micro-wires on, in, or adjacent to the common side of the flexible substrate in the touch portion, the wrappable edge portion, and the circuit portion in common steps using common materials, one or more of the micro-wires extending from the touch portion, through the wrappable edge portion, and into the circuit portion, wherein the micro-wires have a width that is less than 15 microns;
locating one or more electrical circuits on or in the circuit portion and electrically connecting the one or more electrical circuits to corresponding extended micro-wires; and
locating the flexible substrate in relation to a display with the touch portion located adjacent to a display viewing side and wrapping the wrappable edge portion around an edge of the display from the display viewing side to a display back side wherein the touch portion has a touch-portion edge which is parallel to the edge of the display;
wherein any micro-wires through which electrical signals are provided and which extend through the wrappable edge portion are non-orthogonal to the touch-portion edge.

2. The method of claim 1, further including printing circuits on the flexible substrate or affixing circuits to the flexible substrate.

3. The method of claim 1, further including cutting the flexible substrate from a web.

4. The method of claim 1, further including locating a protective layer on the micro-wires in the wrappable edge portion.

5. The method of claim 4, further including laminating or coating a protective layer on the micro-wires in the wrappable edge portion.

6. The method of claim 4 wherein the protective layer has a thickness that is equal to or greater than a thickness of the flexible substrate.

7. The method of claim 1 further including locating a common protective layer on the wrappable edge portion and the touch portion.

8. The method of claim 1 further including coating the common side of the flexible substrate with an uncured layer, imprinting the uncured layer to form micro-channels in the uncured layer, curing the uncured layer to form a cured layer, coating the cured layer and micro-channels with a conductive ink, removing the conductive ink from the surface of the cured layer leaving the conductive ink in the micro-channels, and curing the conductive ink to form micro-wires in the micro-channels.

9. The method of claim 1 further including providing a patterned stamp, coating the patterned stamp with a conductive ink, and printing the conductive ink on the common side of the flexible substrate.

10. The method of claim 1 further including rolling up the flexible substrate into a rolled configuration.

11. The method of claim 1, further including adhering the touch portion to the display viewing side and adhering the circuit portion to the display back side.

12. The method of claim 1, wherein the flexible substrate has an opposite side opposing the common side and further including adhering the opposite side of the flexible substrate to the display.

13. The method of claim 1, further including affixing circuits to the flexible substrate after the flexible substrate is located in relation to the display.

14. The method of claim 1 further including providing or arranging the flexible substrate in a flat configuration, processing the flexible substrate to form the micro-wires while the flexible substrate is in the flat configuration, and then bending the flexible substrate to locate the flexible substrate in relation to the display.

15. The method of claim 1 wherein the touch portion has a plurality of touch-portion edges, the flexible substrate further includes a plurality of circuit portions and wrappable edge portions, and each wrappable edge portion is located between a corresponding touch-portion edge and a corresponding circuit portion, and further including locating the flexible substrate in relation to the display with the touch portion located adjacent to the display viewing side, and each wrappable edge portion wrapping around the display from the display viewing side to the display back side.

16. The method of claim 15 further including adhering a first circuit portion to the display back side and overlapping a second circuit portion over the one circuit portion.

17. The method of claim 15 further including adhering each of the first and second circuit portions to a different portion of the display back side without overlapping the first and second circuit portions.

18. A method of making a wrap-around micro-wire circuit structure, comprising:
   providing a display, the display having a display viewing side, a display back side opposite the display viewing side, and a display edge;
   providing a flexible substrate having a touch portion, an edge portion, and a circuit portion on a common side of the flexible substrate, the edge portion located between the touch portion and the circuit portion;
   forming a plurality of electrically conductive micro-wires on, in, or adjacent to the common side of the flexible substrate in the touch portion, the edge portion, and the circuit portion in common steps using common materials, one or more of the micro-wires extending from the touch portion, through the edge portion, and into the circuit portion;
   locating one or more electrical circuits on or in the circuit portion and electrically connecting the one or more electrical circuits to corresponding extended micro-wires; and
   locating the flexible substrate in relation to the display with the touch portion located adjacent to the display viewing side, the circuit portion located adjacent to the display back side, and the edge portion wrapping around the display edge from the display viewing side to the display back side.

* * * * *